(12) United States Patent
Wan et al.

(10) Patent No.: US 8,093,788 B2
(45) Date of Patent: Jan. 10, 2012

(54) LIGHT EMITTING DEVICE PACKAGE FOR TEMEPERATURE DETECTION

(75) Inventors: Shan Mei Wan, New Territories (HK); Chi Hang Cheung, New Territories (HK); Ming Lu, New Territories (TW)

(73) Assignee: Hong Kong Applied Science and Technology Research Institute Co. Ltd., Hong Kong (CN)

( * ) Notice: Subject to any disclaimer, the term of this patent is extended or adjusted under 35 U.S.C. 154(b) by 247 days.

(21) Appl. No.: 12/395,756

(22) Filed: Mar. 2, 2009

(65) Prior Publication Data
US 2010/0219733 A1 Sep. 2, 2010

(51) Int. Cl.
*H01J 7/24* (2006.01)
(52) U.S. Cl. .......................... 313/10; 313/506
(58) Field of Classification Search .............. 313/10, 313/11, 13, 506, 512
See application file for complete search history.

(56) References Cited

U.S. PATENT DOCUMENTS

| 6,880,234 B2 | 4/2005 | Khan |
| 6,998,594 B2 | 2/2006 | Gaines et al. |
| 7,306,967 B1 | 12/2007 | Kozhukh |
| 7,322,718 B2 | 1/2008 | Setomoto et al. |
| 2007/0200512 A1* | 8/2007 | Gotou et al. .................. 315/309 |

FOREIGN PATENT DOCUMENTS

| CN | 1828856 A | 9/2006 |
| CN | 1947267 A | 4/2007 |
| JP | 2003272835 A | 9/2003 |
| WO | 2009016913 A1 | 2/2009 |

OTHER PUBLICATIONS

International Search Report and the written opinion of the international searching authority, or the declaration dated Dec 10, 2009 for PCT/CN2009/070604 in 13 pages.

\* cited by examiner

*Primary Examiner* — Bumsuk Won
(74) *Attorney, Agent, or Firm* — Brooks Kushman P.C.

(57) ABSTRACT

A light emitting device package and a lighting system are provided. According to one embodiment, a functional substrate; at least one light emitting element bonded onto the functional substrate; and at least one design-in thermal detection unit built onto the functional substrate are provided, wherein the design-in thermal detection unit is proximate to the light emitting element, and wherein the design-in thermal detection unit is configured to detect the temperature and transmit a temperature signal. The design-in thermal detection unit may be an NTC thermistor based on a semiconductor substrate. A control system may be included to detect temperature and make any necessary current adjustments in order to maintain consistent performance of the light emitting element.

14 Claims, 17 Drawing Sheets

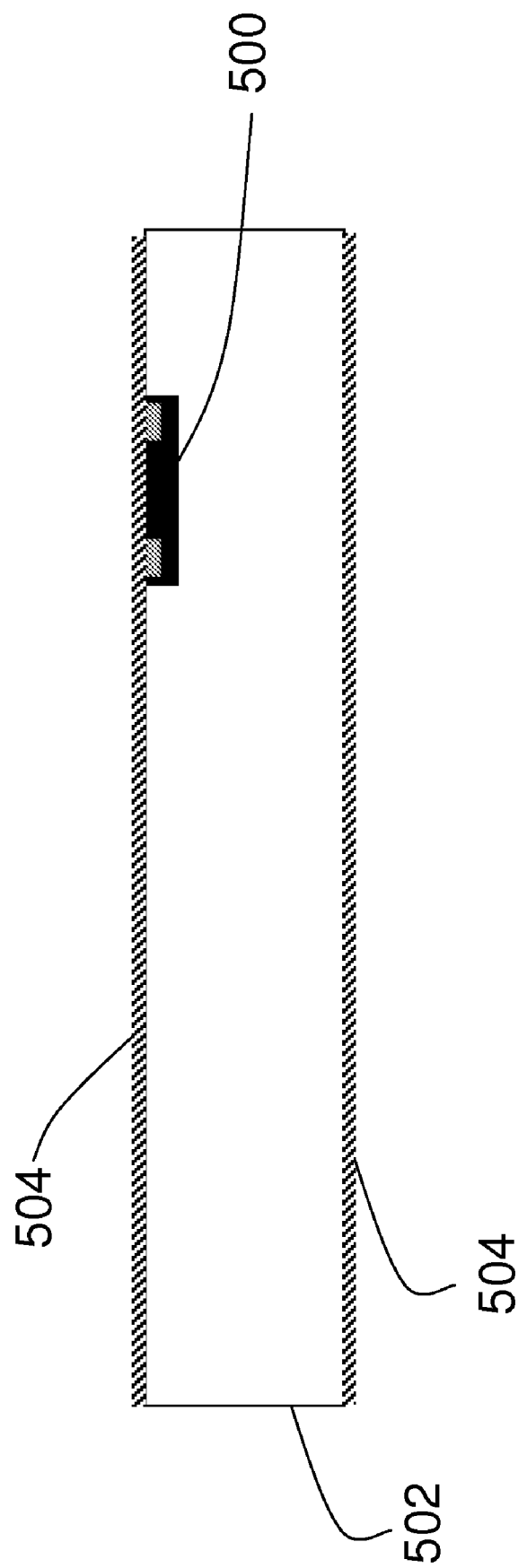

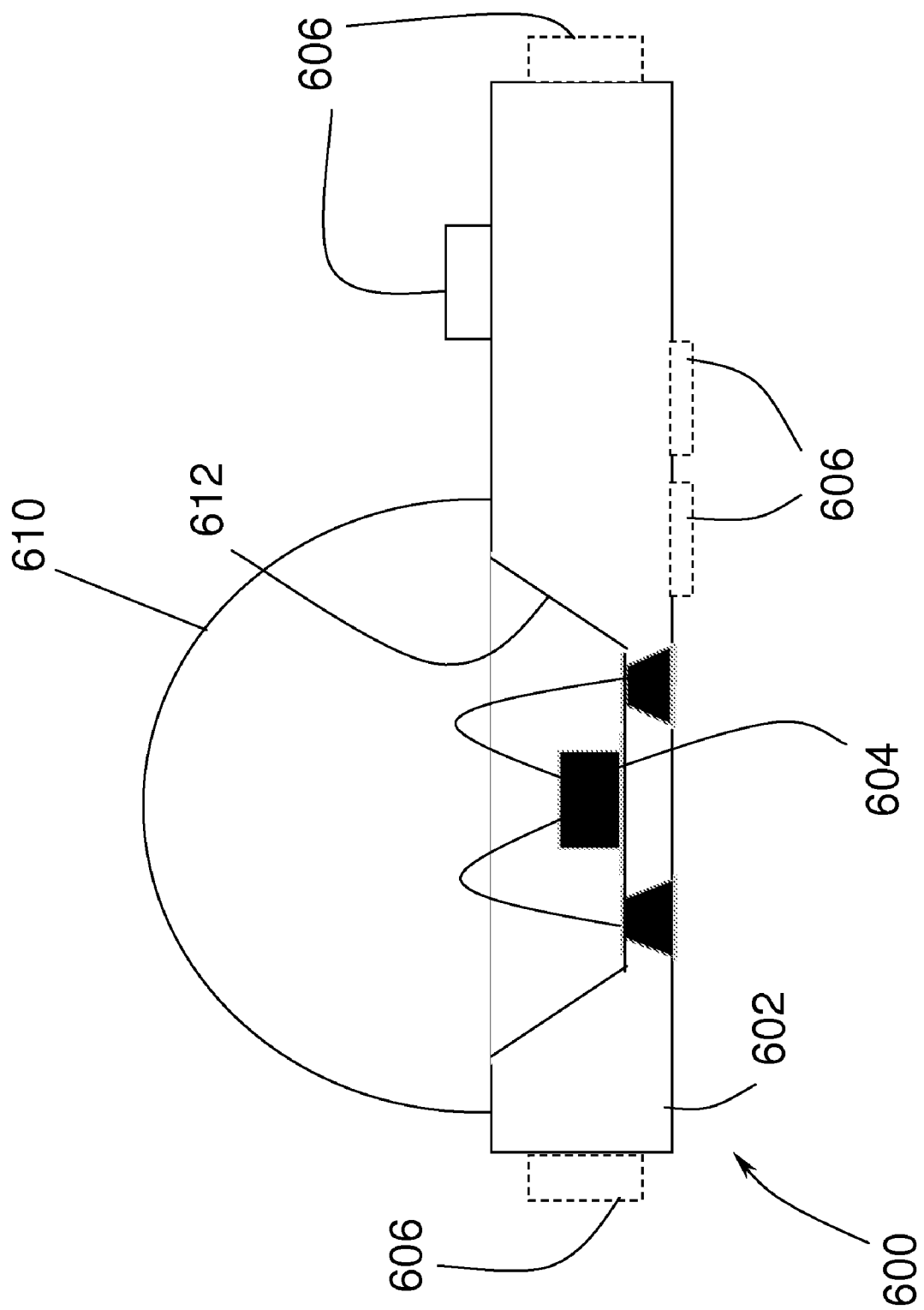

US 8,093,788 B2

LIGHT EMITTING DEVICE PACKAGE FOR TEMEPERATURE DETECTION

FIELD OF THE INVENTION

The present invention relates to a light emitting device package, and more particularly, to a light emitting device package having a design-in thermal detection unit for temperature detection and temperature control.

BACKGROUND OF THE INVENTION

Light emitting diodes (hereinafter referred to as "LEDs") is currently one of the most innovative and fastest growing technologies in the semiconductor industry. While LEDs have been in use for decades as indicators and for signaling purposes, technology developments and improvements have allowed for a broader use of LEDs in illumination applications.

The use of LEDs in illumination applications is attractive for a number of reasons, including the ability to produce more light per watt, a longer lifetime, smaller sizes, greater durability, environmental friendliness, and flexibility in terms of coloring, beam control, and dimming.

The main applications of LED luminaries are LCD backlighting, white light illumination, mood lighting and automotive lighting. It is known that the optical characteristics of LED luminaries, especially the red LEDs, vary greatly with changes in environmental temperature. Accordingly, the luminous intensity, CRI (color rendering index), CCT (correlated color temperature) and chromaticity values of LED luminaries used in a cold climate will differ from those of the same LED luminaries used in a warmer climate. Therefore, one major problem with LED luminaries in illumination applications is providing a consistent and expected optical performance that does not vary with changes in environmental temperature.

Earlier attempts have been made to detect the temperature of the LEDs and then make adjustments by an external power supply to maintain the performance consistency of the LED module. However, the previous efforts have had the following shortcomings: the form factor of the LED module cannot be very small; the response time is slow and not accurate enough because the distance between the temperature detection unit and the LED is large; the light of the LED is obstructed; calibration is needed for each LED module; and soldering perform hierarchy problem exists. As a result, the above functional, performance and cost limitations have failed to provide an effective LED module. Accordingly, there is a need for a light emitting device package that addresses these and other shortcomings of LED modules.

SUMMARY OF THE INVENTION

According to one embodiment of the present invention, a light emitting device package is disclosed. The light emitting device package includes a functional substrate; at least one light emitting element bonded onto the functional substrate; and at least one design-in thermal detection unit built onto the functional substrate, wherein the design-in thermal detection unit is proximate to the light emitting element, and wherein the design-in thermal detection unit is configured to detect the temperature and transmit a temperature signal.

According to another embodiment of the present invention, a lighting system is disclosed. The lighting system includes a functional substrate; at least one light emitting element bonded onto the functional substrate; and at least one design-in thermal detection unit built onto the functional substrate, wherein the design-in thermal detection unit is proximate to the light emitting element, and wherein the design-in thermal detection unit is configured to detect the temperature and transmit a temperature signal; a power source operably coupled to the at least one light emitting element, the power source configured to provide a current to the at least one light emitting element; and a microcontroller unit operably coupled to the power source and the design-in thermal detection unit, the microcontroller unit configured to control the current provided from the power source to the at least one light emitting element, the microcontroller unit further configured to receive the temperature signal from the design-in thermal detection unit.

According to another embodiment of the present invention, a method of fabricating a light emitting device package having a design-in thermal detection unit is disclosed. The method includes providing a semiconductor substrate; building a design-in thermal detection unit on the semiconductor substrate; growing a passivation layer on the semiconductor substrate; patterning the semiconductor substrate with one or more masks, and etching the passivation layer and the substrate and the one or more masks using one or more fabrication steps to form a layout design on the semiconductor substrate; and forming one or more metal traces and platforms on the semiconductor substrate.

Still other embodiments of the present invention will become readily apparent to those skilled in the art from the following detailed description, wherein embodiments of the invention are described by way of illustration. As will be realized, the invention is capable of other and different embodiments and its several details are capable of modifications in various respects, all without departing from the spirit and the scope of the present invention.

BRIEF DESCRIPTION OF THE DRAWINGS

FIGS. 5A to 5K illustrate an example fabrication processes flow of a semiconductor based functional substrate having a design-in thermal detection unit built onto the semiconductor based functional substrate, in accordance with an embodiment of the present invention.

FIG. 6A is a cross-sectional view of a light emitting device package, in accordance with a third embodiment of the present invention.

DETAILED DESCRIPTION

In the following description, reference is made to the accompanying drawings where, by way of illustration, specific embodiments of the invention are shown. It is to be understood that other embodiments may be used as structural and other changes may be made without departing from the scope of the present invention. Also, the various embodiments and aspects from each of the various embodiments may be used in any suitable combinations. Accordingly, the drawings and detailed description are to be regarded as illustrative in nature and not as restrictive.

Generally, embodiments of the present invention are directed to a light emitting element mounted onto a semiconductor based functional substrate having a design-in thermal detection unit for temperature detection. The thermal detection unit is considered "design-in" in that only one conventional semiconductor based fabrication process is needed to fabricate both the thermal detection unit and the functional substrate. As the optical characteristics and performance of the light emitting element change due to changes in ambient temperature and junction temperature, embodiments of the present invention incorporate the thermal detection unit to detect temperature and changes in temperature and transmit a temperature signal to a control unit so that any necessary current adjustments can be made to maintain consistent performance of the light emitting element.

Figure 1:
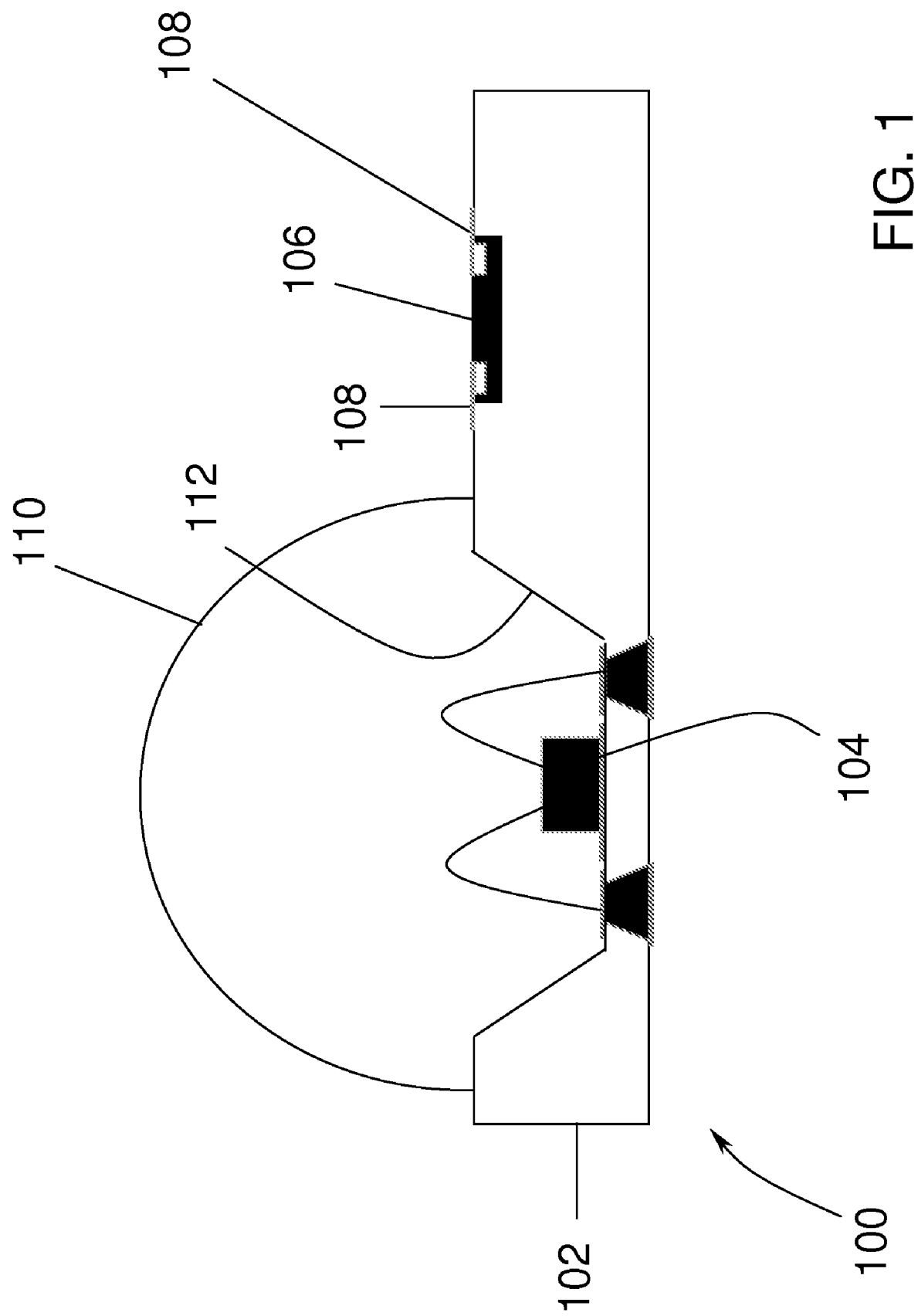
FIG. 1 is a cross-sectional view of a light emitting device package, in accordance with an embodiment of the present invention.

Referring now to the figures, FIG. 1 is a cross-sectional view of a light emitting device package 100, in accordance with an embodiment of the present invention. The light emitting device package 100 includes a functional substrate 102, a light emitting element 104 mounted onto the functional substrate 102, a thermal detection unit 106, metal trace 108 to operably couple the light emitting element 104 to the thermal detection unit 106, and a lens 110 to cover and protect the light emitting element 104. A cavity 112 may be formed into the functional substrate 102 to accommodate the light emitting element 104.

According to one embodiment, the thermal detection unit 106 is a design-in thermistor formed during the fabrication of the functional substrate 102. The functional substrate 102 may be made from any suitable semiconductor materials, such as silicon, germanium, or other silicon based or germanium based compounds. The light emitting element 104 is, for example, die-attached after the fabrication. The light emitting element 104 may be a single light emitting element, a plurality of light emitting elements, or a plurality of red, green and blue light emitting elements die bonded and wire bonded onto the functional substrate 102. Because the thermal detection unit 106 is design-in, only one conventional semiconductor based fabrication process is required to fabricate both the functional substrate 102 and the thermal detection unit 106. Other optical components may also be encapsulated onto the functional substrate 102.

Figure 2:
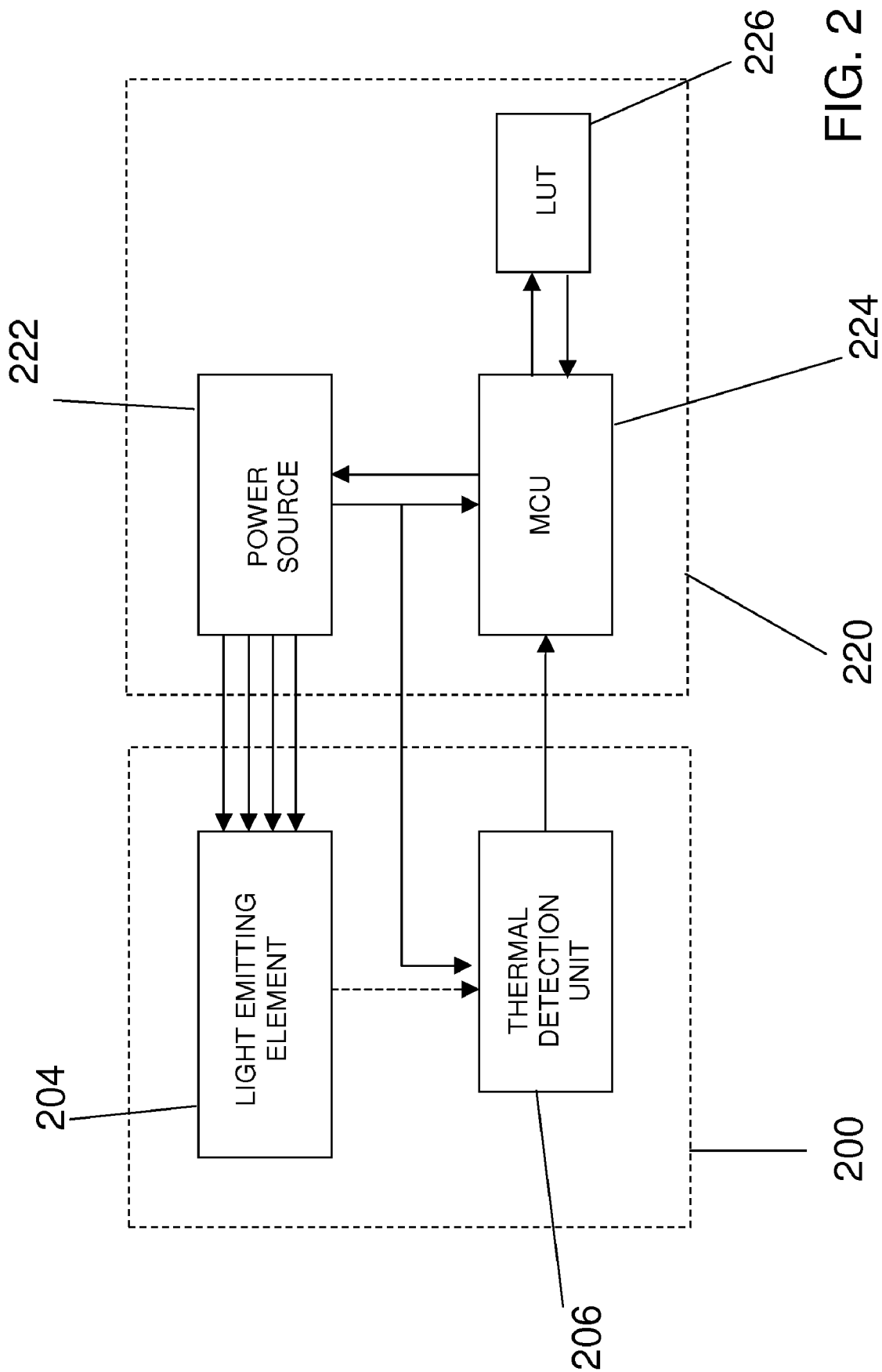
FIG. 2 is a block diagram illustrating the operation of a lighting system including the light emitting device package, in accordance with an embodiment of the present invention.

FIG. 2 is block diagram illustrating the operation of a lighting system including the light emitting device package 200, in accordance with an embodiment of the present invention. The light emitting device package 200 includes the light emitting element 204 and the thermal detection unit 206. The light emitting device package 200 is in operable communication with a control system 220 including a power source 222 and a microcontroller unit 224 (hereinafter referred to as "MCU"), and the MCU is in operable communication with lookup tables 226 (hereinafter referred to as "LUT").

According to embodiments of the present invention, a closed loop control operates as follows: (1) current is delivered to the light emitting element from the power source; (2) the design-in thermal detection unit detects the temperature of the light emitting element and transmits the temperature signal to the control system; and (3) self-adjustment of the current delivered to the light emitting element is performed to ensure that the light emitting element operates according to predetermined specifications. The MCU operates with the LUT to determine what self-adjustment of the current, if any, is necessary. Other data structures and controls systems may also be used to perform the monitoring and adjustment of the current.

Figure 3:
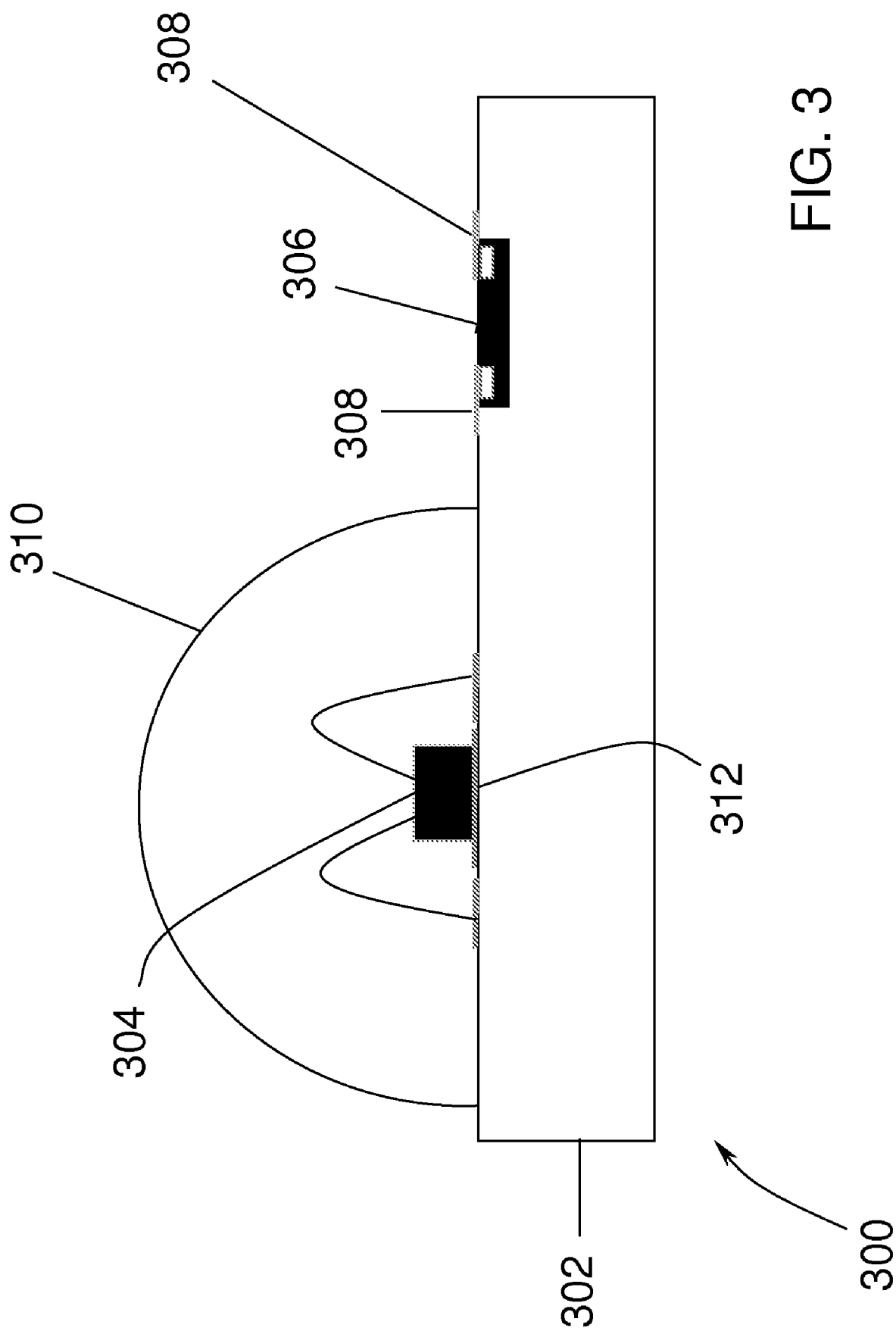
FIG. 3 is a cross-sectional view of a light emitting device package, in accordance with a second embodiment of the present invention.

FIG. 3 is a cross-sectional view of a light emitting device package 300, in accordance with a second embodiment of the present invention. The light emitting device package 300 includes a semiconductor based functional substrate 302, a light emitting element 304 bonded onto the functional substrate 302, a design-in thermal detection unit 306, metal trace 308 to operably couple the light emitting element 304 to the thermal detection unit 306, and a lens 310 to cover and protect the light emitting element 304. A light emitting element platform 312 is formed onto the functional substrate 302 to accommodate the light emitting element 304.

Figure 4:
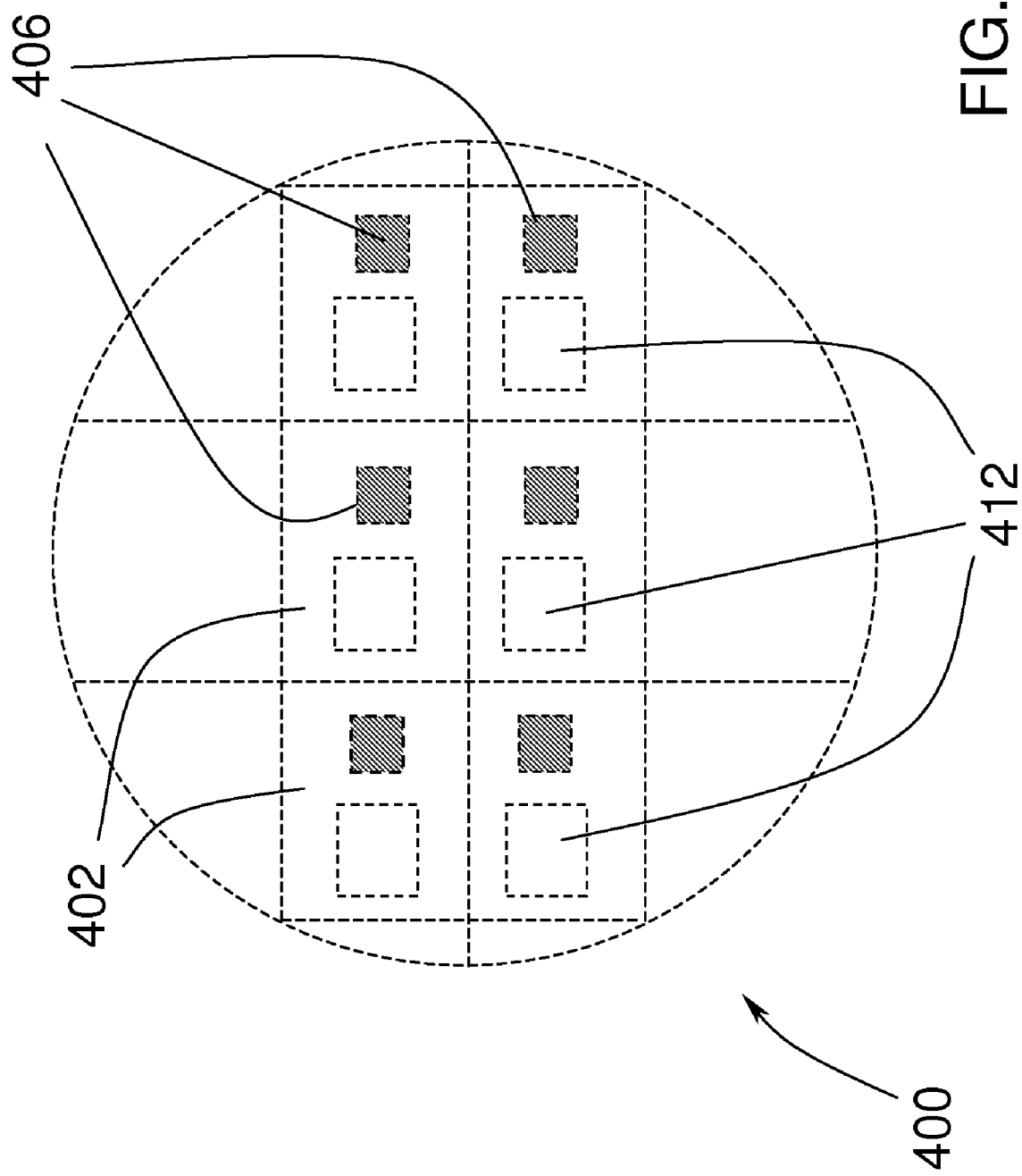
FIG. 4 is a plan view of a partial, simplified semiconductor wafer layout illustrating thermal detection unit positioning, in accordance with an embodiment of the present invention.

FIG. 4 is a plan view of a partial, simplified semiconductor wafer layout illustrating thermistor positioning on the functional substrate, in accordance with an embodiment of the present invention. A simplified semiconductor wafer 400 shows a plurality of functional substrate sections 402. The mask may be replicated according to the illustrated example layout with the design-in thermal detection unit 406 positioned so that there is sufficient space for the creation of a light emitting element platform 412 on the functional substrate. Each of the plurality of substrate sections 402 will be cut to form separate packages for inclusion into a light emitting element or other light emitting devices. According to one embodiment, each of the thermal detection units 406 is offset to a side of the substrate section 402. Each of the thermal detection units 406 is positioned proximate to the light emitting element platform 412 in order to detect the temperature of the light emitting element precisely. A close proximity of the thermal detection unit 406 to the later attached light emitting element may result in greater accuracy. While each of the substrate sections 402 is shown being substantially the same as each other, the position of the thermal detection unit 406 may vary according to the required layout design.

Figure 5A:
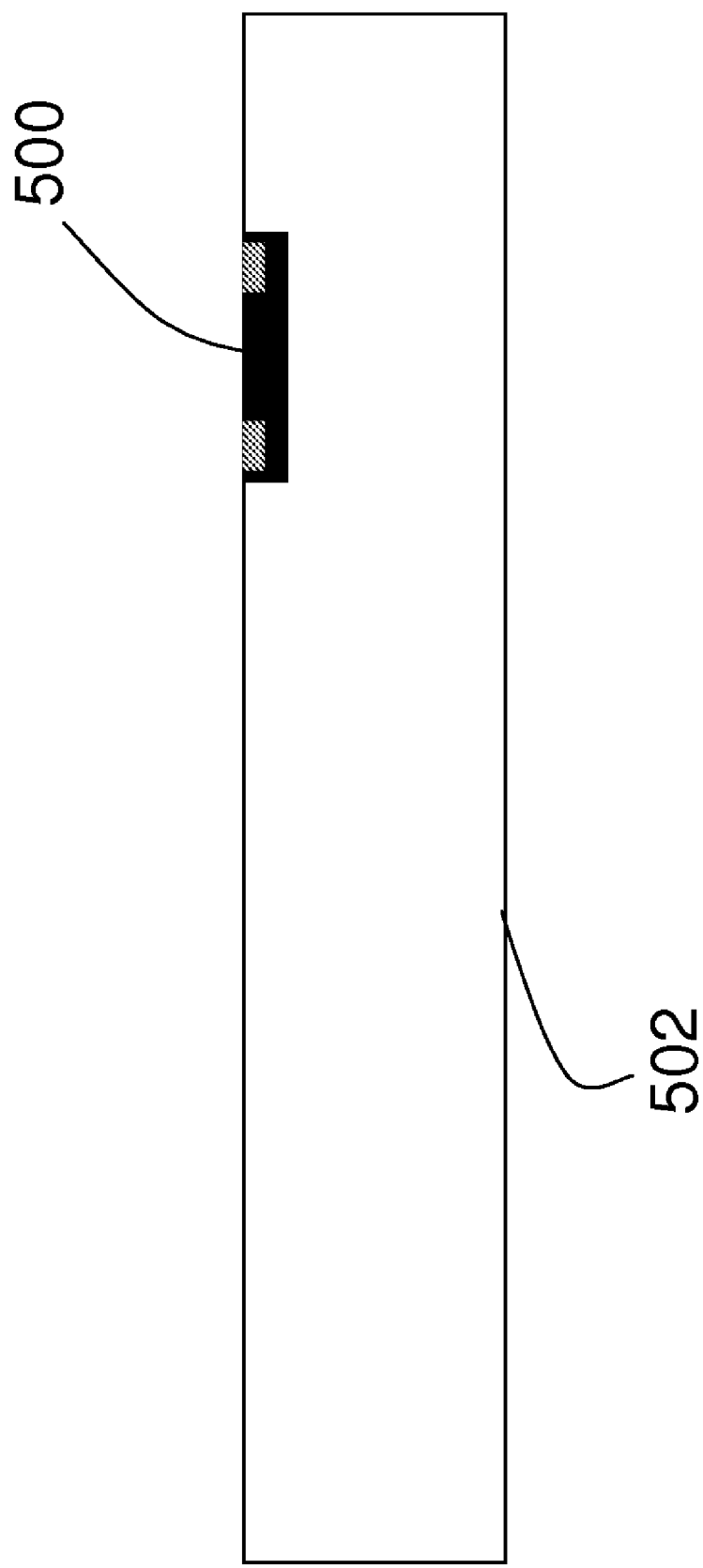
Figure 5C:
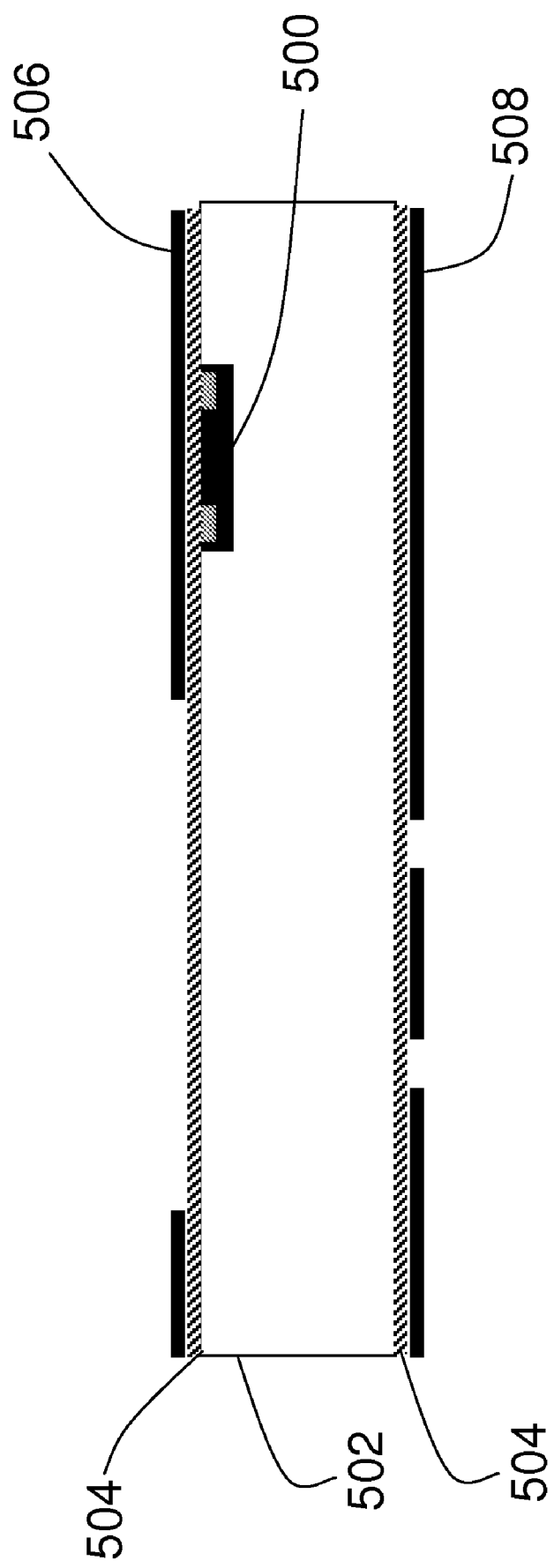
Figure 5D:
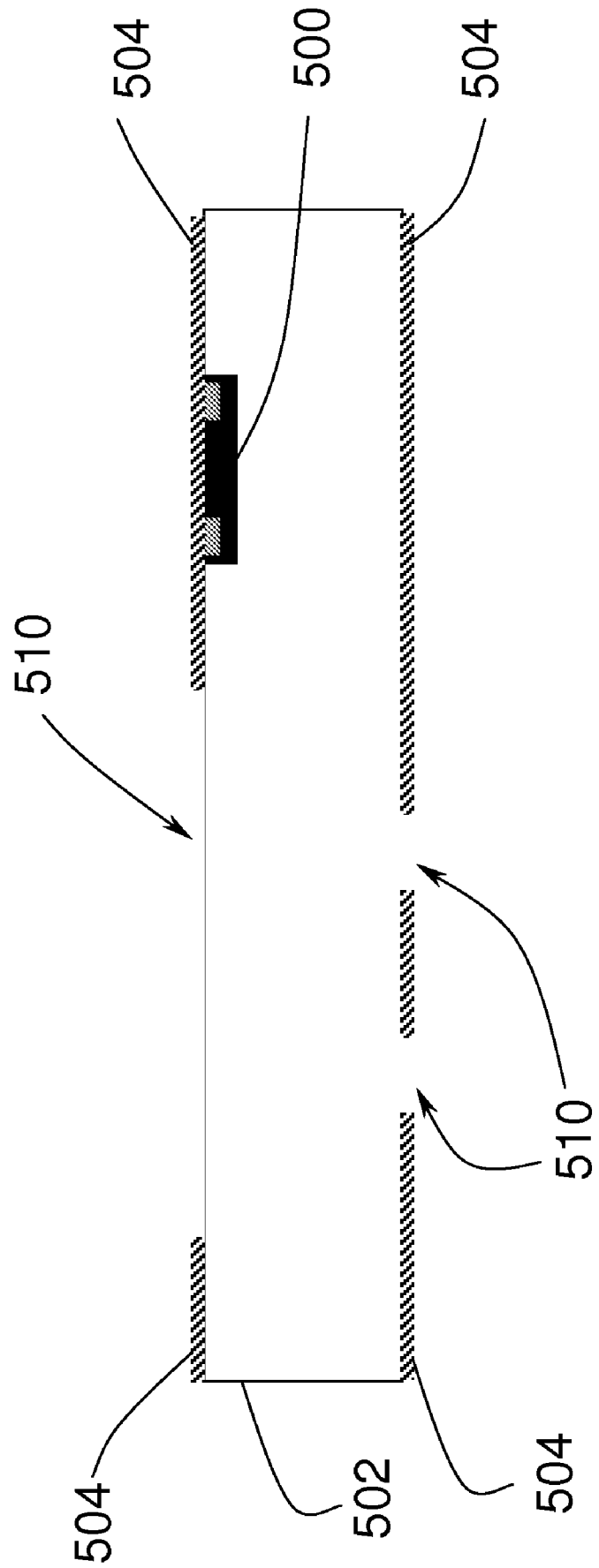
Figure 5E:
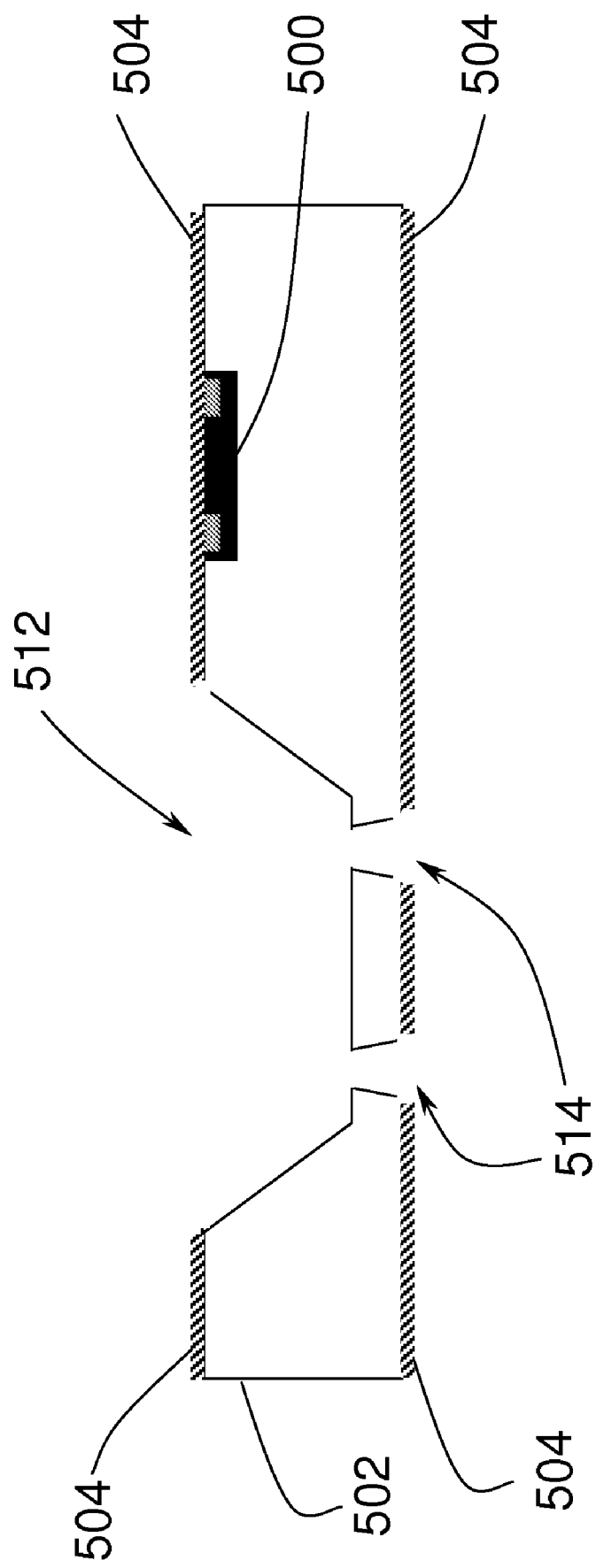
Figure 5F:
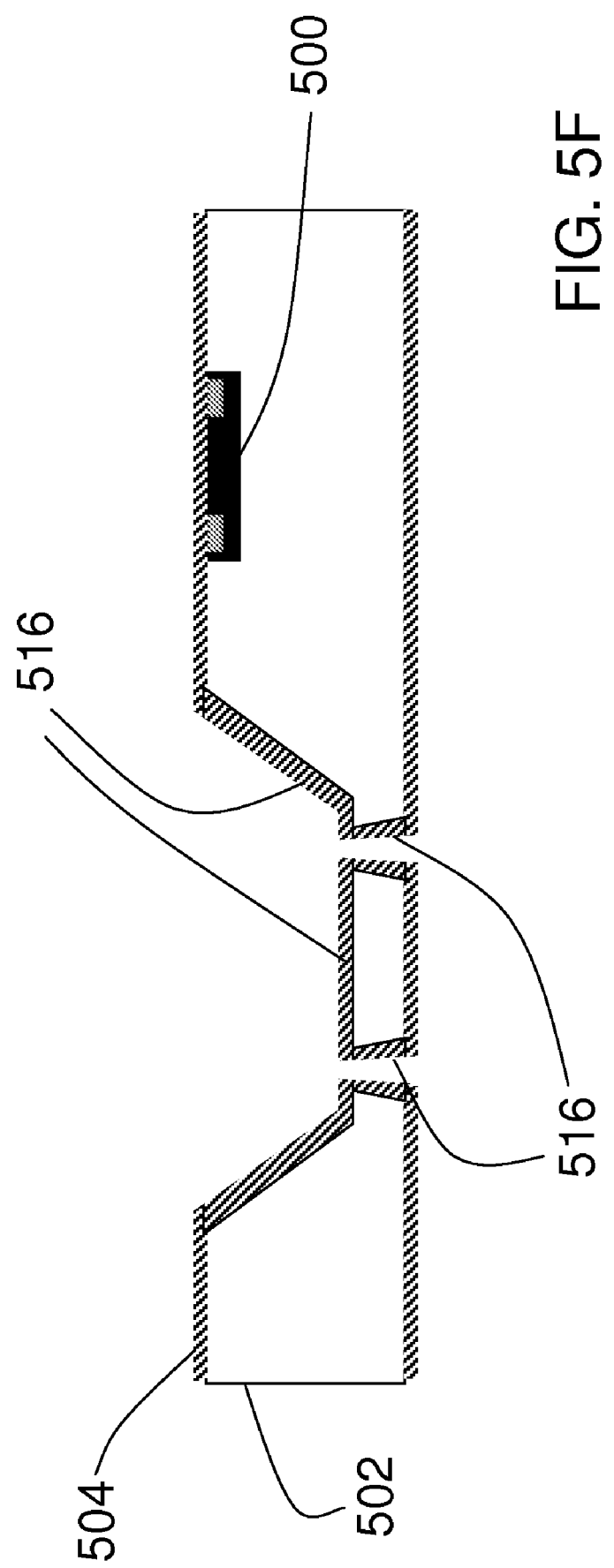
Figure 5G:
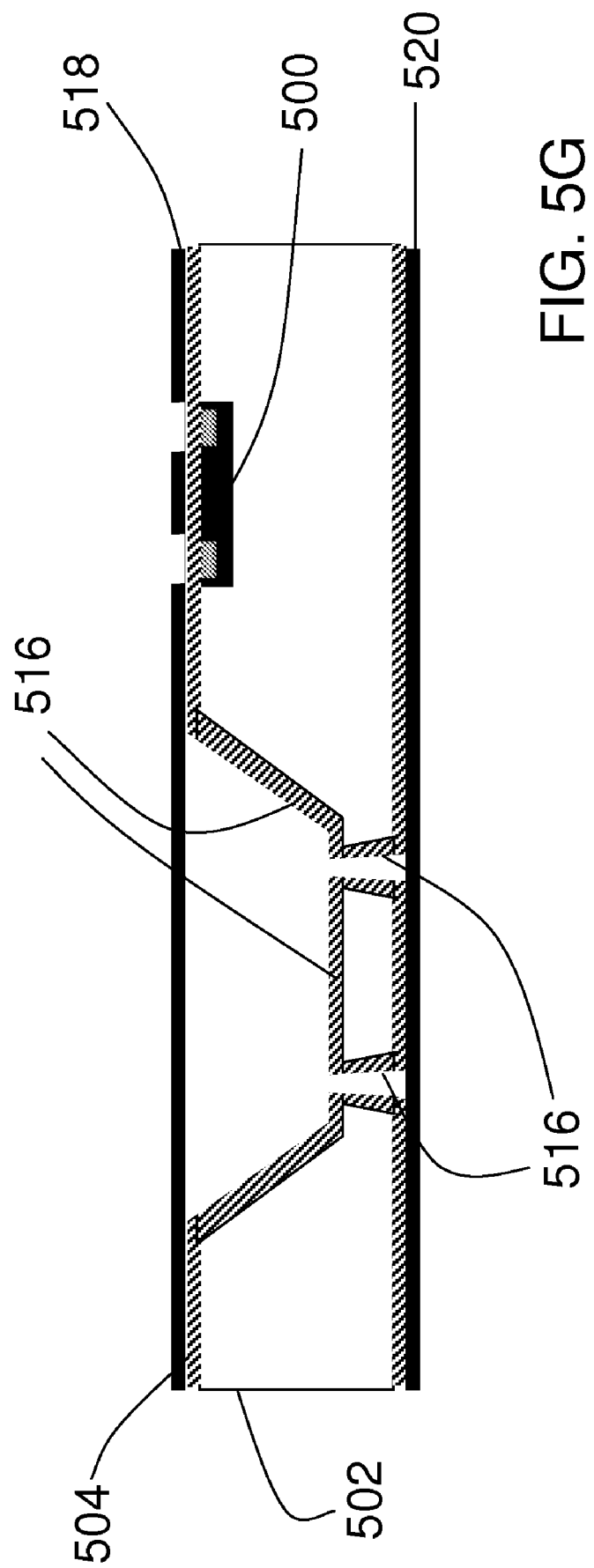
Figure 5H:
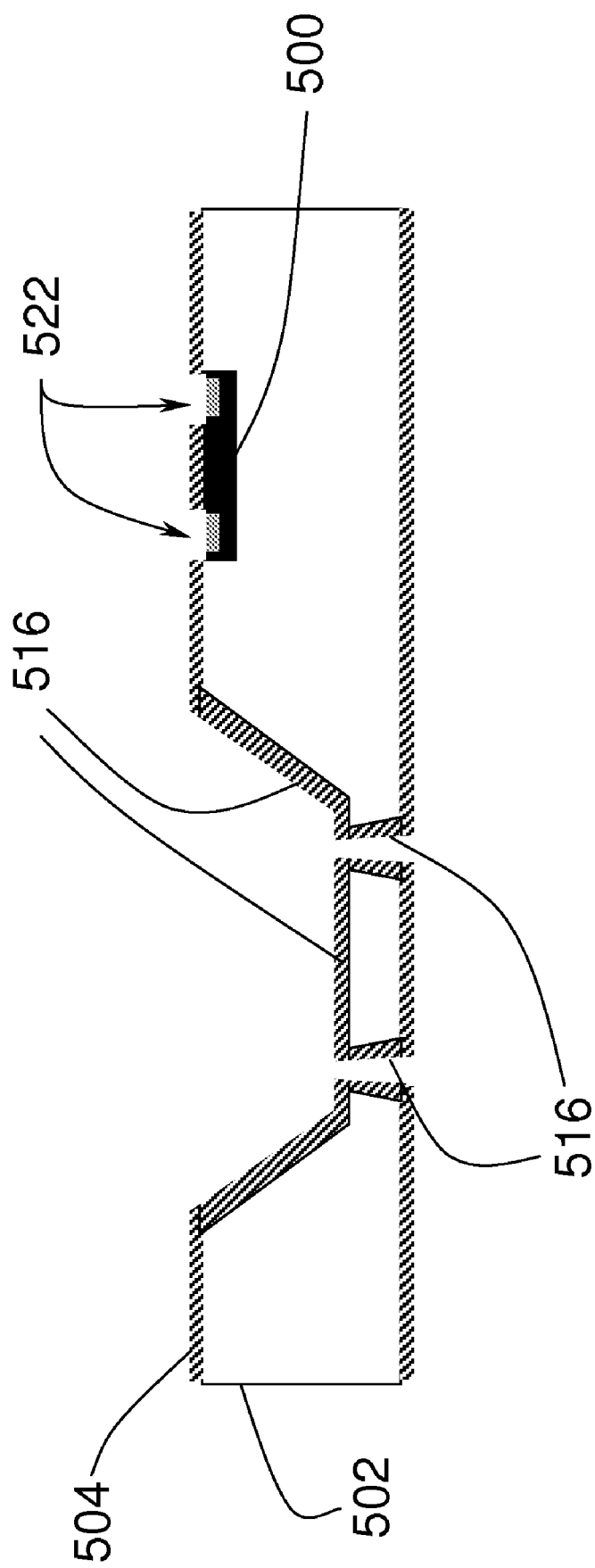
Figure 5I:
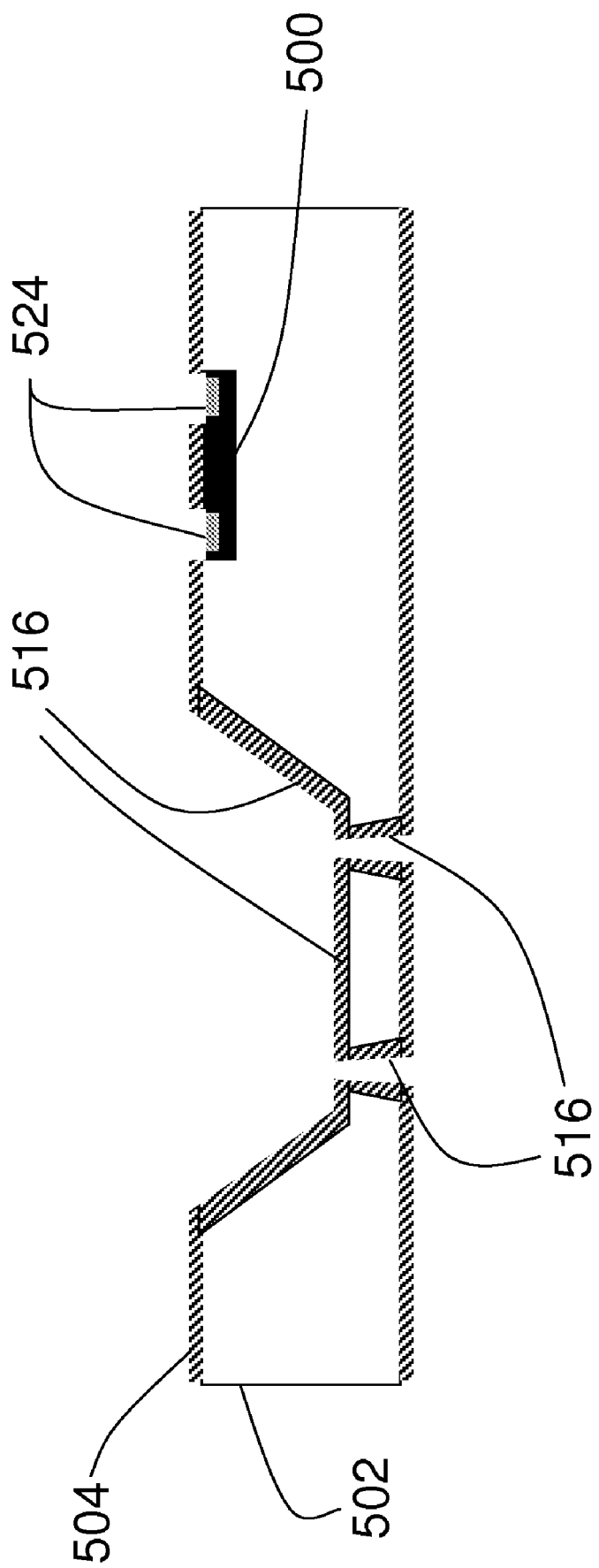
Figure 5J:
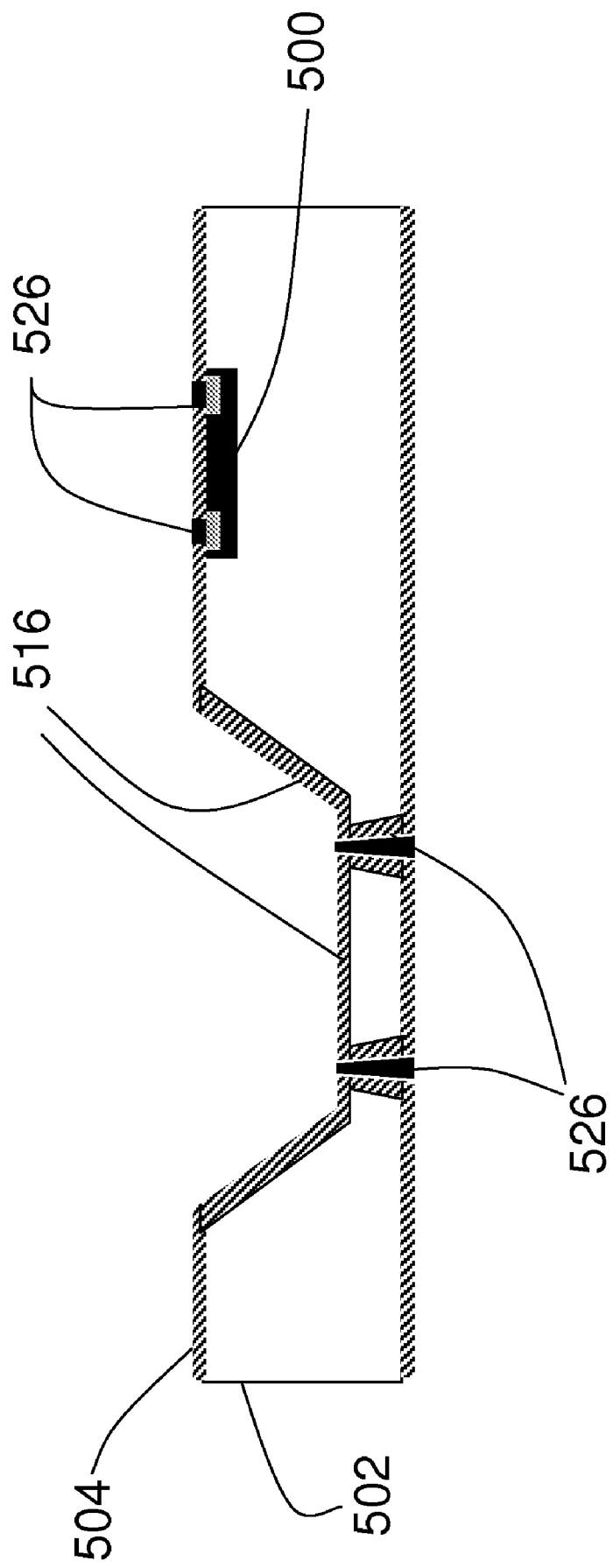
Figure 5K:
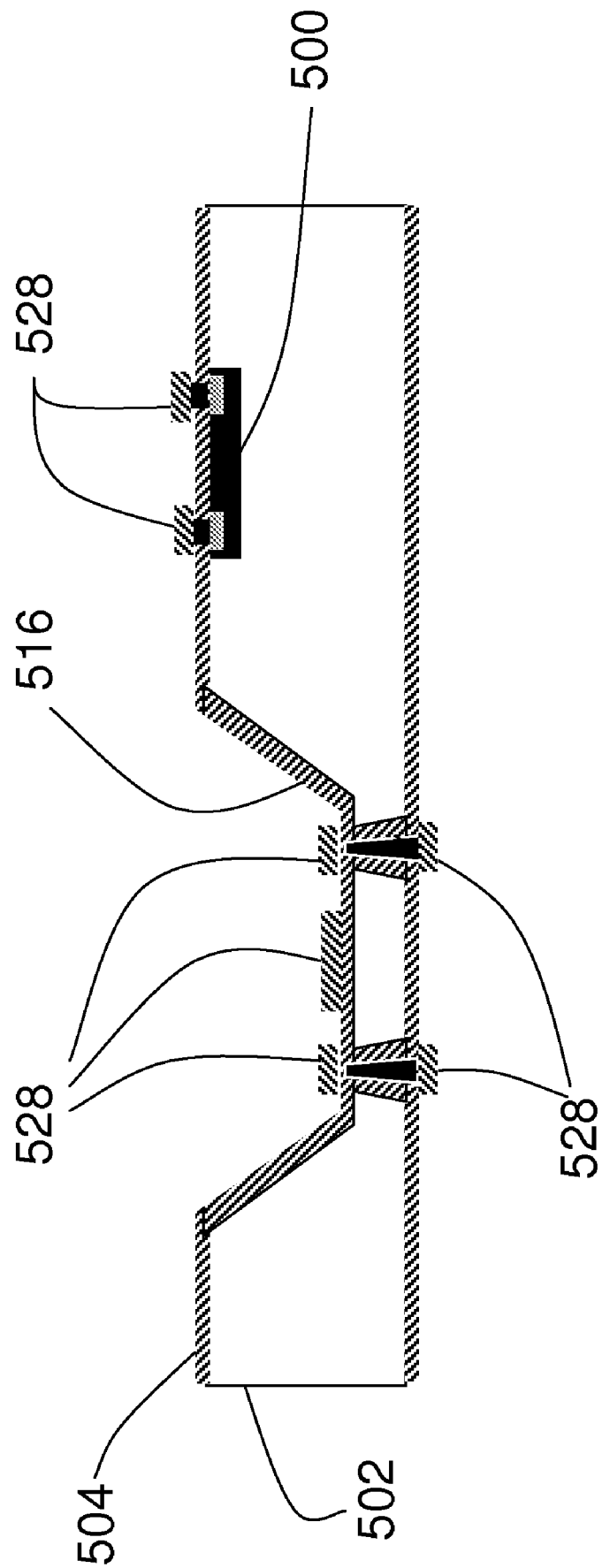

FIGS. 5A to 5K illustrate an example fabrication processes flow of a semiconductor based functional substrate having a design-in thermal detection unit built onto the semiconductor based functional substrate, in accordance with an embodiment of the present invention. As shown in FIG. 5A, a thermal detection unit 500 is made by a thin film method based on a semiconductor wafer 502. The thermal detection unit 500 can be any NTC or PTC thermistor and is referred to here as a "NTC thermistor." The semiconductor wafer 502 may be any substrate made from any semiconductor materials such as silicon, germanium, and silicon based or germanium based compounds, and is referred to here as a "p-type silicon wafer". Referring to FIG. 5B, the silicon wafer 502 is placed in a furnace and then thermally oxidized to grow a layer of thin silicon dioxide, which is a passivation layer 504. Referring to FIG. 5C, the passivation layers 504 are patterned with a first mask 506 and a second mask 508 to define etching regions of the silicon wafer 502. Referring to FIG. 5D, the passivation layers 504 within the etching regions are etched by, for example, a buffered oxide etch (BOE) to expose etching regions 510 of the silicon wafer 502. Referring to FIG. 5E, the etching regions are etched by, for example, non-isotropic wet etching with potassium hydroxide (KOH) to a certain depth, which forms a depression 512 in the silicon wafer 502 and at the same time two through holes 514 on the bottom of the silicon wafer 502. Referring to FIG. 5F, the silicon wafer 502 is placed in the furnace again to grow a layer of silicon dioxide as an insulation layer 516. Referring to FIG. 5G, the insulation layer 516 is patterned with a third mask 518 and a fourth mask 520 to define the etching region of the NTC thermistor 500. Referring to FIG. 5H, the insulation layer 516 is then etched by BOE to expose etching regions 522 of the thermistor 500. Referring to FIG. 5I, the etching regions 522 are etched by non-isotropic wet etching (KOH) to a certain depth, which exposes 524 conductor terminals of the NTC thermistor 500. Referring to FIG. 5J, conductive materials 526, such as solder paste, are respectively printed into the through holes at the bottom and the NTC thermistors 500 conductor terminals 524 at the top. The silicon wafer is heated to soften the solder materials, making them fill up the through holes 514 and the openings of the NTC thermistor conductor terminals 524. Lastly, referring to FIG. 5K, an under bump metallization (UBM) process is carried out to form I/O ports, metal platforms, or other conductive elements 528 on the substrate.

Figure 6B:
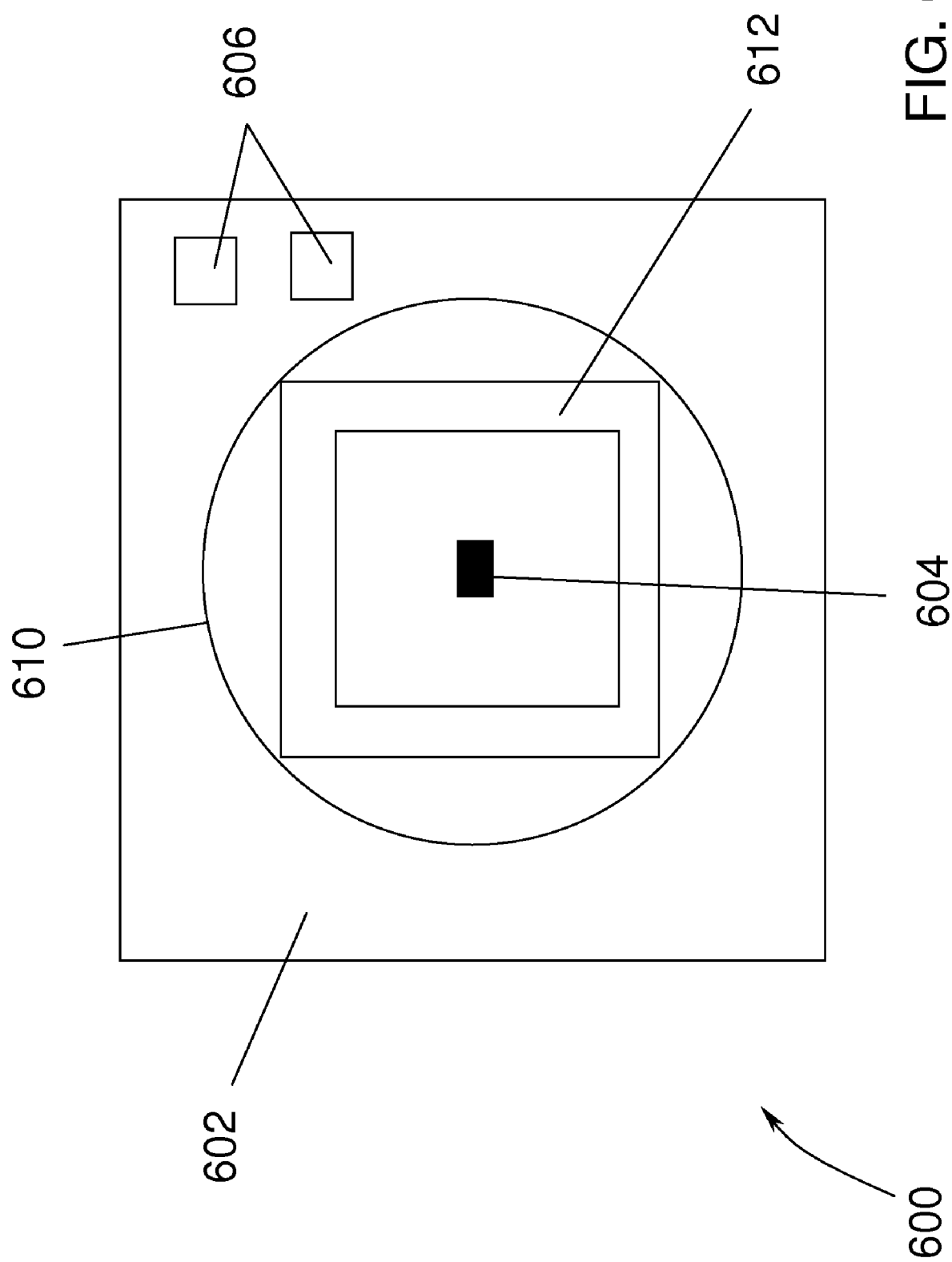
FIG. 6B is a plan view of the light emitting device package shown in FIG. 6A, in accordance with the third embodiment of the present invention.

Referring now to FIGS. 6A and 6B, FIG. 6A is a cross-sectional view of a light emitting device package and FIG. 6B is a plan view of the light emitting device package shown in FIG. 6A, in accordance with a third embodiment of the present invention. The light emitting device package 600 includes a functional substrate 602, a light emitting element 604 mounted onto the functional substrate 602, a plurality of metal pads 606, and a lens 610 to cover and protect the light emitting element 604. A cavity 612 may be formed onto the functional substrate 602 to accommodate the light emitting element 604.

According to the third embodiment illustrated in FIGS. 6A and 6B, the functional substrate 602 may function as a thermistor by the attachment of metal pads 606. Thus the functional substrate 602 is also a design-in thermistor within the spirit and scope of this invention. Accordingly, the resistance of the functional substrate 602 may be measured, thereby permitting the measurement of any temperature changes. While a small, closely located design-in thermistor may provide greater accuracy, use of the functional substrate 602 as a thermistor will also provide a general temperature reading of the light emitting element environment.

According to one embodiment of the invention, design-in fabrication of the thermistor provides for the performance of the thermistor to be controlled and assured. Accordingly, because there may be no need for post-fabrication mounting of the thermistor onto the package, lower cost and greater consistency in the finished product can be provided.

Embodiments of the present invention provide a number of advantages over the prior art. According to one embodiment, production of a light emitting device package of the present invention presents no soldering perform hierarchy problem. Therefore, where conventional, post-fabrication die attachment or embedding of a thermistor and light emitting elements may present soldering perform hierarchy issues, embodiments of the present invention avoid such soldering perform hierarchy issues. Additionally, embodiments of the present invention may have a generally small form factor, which is attractive for spot lamp application, and a generally short thermal path from the light emitting element chip to the thermal detection unit. Therefore, the thermal detection unit may be closer to the light emitting element providing a faster and more accurate response. Additionally, the thermal detection unit, according to embodiments of the present invention, causes little or no blockage of light from the light emitting elements as it is fabricated together with the functional substrate. Furthermore, embodiments of the present invention may avoid other issues that can occur as a result of post-fabrication attachment of thermal chips or other components, such as contamination and consistency problems.

According to one embodiment of the present invention, a Si-MEMs surface for light reflection of the optical cavity can also be made at the same time, during the fabrication of the thermal detection unit and the functional substrate, which saves money and time when making an extra silver coating of the optical cavity.

While the invention has been particularly shown and described with reference to the illustrated embodiments, those skilled in the art will understand that changes in form and detail may be made without departing from the spirit and scope of the invention. For example, while examples of specific light emitting elements and thermal detection units have been described, any other suitable light emitting elements and thermal detection units may be used. Also, while one specific configuration of the control system has been illustrated and describe, other suitable control systems may be used.

Accordingly, the above description is intended to provide example embodiments of the present invention, and the scope of the present invention is not to be limited by the specific examples provided.

What is claimed is:

1. A light emitting device package comprising:
   a functional substrate;
   at least one light emitting element bonded onto the functional substrate;
   at least one design-in thermal detection unit built onto the functional substrate, wherein the design-in thermal detection unit is proximate to a side of the light emitting element, and wherein the design-in thermal detection unit is configured to detect the temperature of the light emitting element and transmit a temperature signal; and
   at least one pair of pads attached to the functional substrate and configured for electrical connection, and wherein resistance of the functional substrate is indicative of the temperature of the light emitting element and is measurable via an electrical connection with the pads whereby the functional substrate performs as the at least one design-in thermal detection unit when the resistance of the functional substrate is measured to detect the temperature of the light emitting element.

2. The light emitting device package of claim 1, wherein the light emitting element is one or more semiconductor-based devices.

3. The light emitting device package of claim 1, wherein the design-in thermal detection unit is one or more semiconductor-based thermistors.

4. The light emitting device package of claim 1, wherein the design-in thermal detection unit includes doped semiconductor-based materials.

5. The light emitting device package of claim 1, wherein the design-in thermal detection unit measures resistance to determine the temperature of the light emitting element.

6. The light emitting device package of claim 1, further comprising a control system operably coupled to the functional substrate, the control system including a power source configured to provide current to the light emitting element, and wherein the control system receives the temperature signal and selectively adjusts the current in response to the temperature signal.

7. The light emitting device package of claim 1, wherein the control system further includes a microcontroller unit coupled to a look-up table, wherein in the microcontroller unit determines whether an adjustment to the current is required based on the temperature signal.

8. The light emitting device package of claim 1, wherein a single fabrication process is used to fabricate both the design-in thermal detection unit and the functional substrate.

9. The light emitting device package of claim 8, wherein the single fabrication process includes a plurality of masking and etching steps to create a light emitting element platform and the design-in thermal detection unit.

10. The light emitting device package of claim 1, wherein the at least one design-in thermal detection unit is built onto the functional substrate by being formed during fabrication of the functional substrate and the at least one light emitting element is bonded onto the functional substrate after the fabrication of the functional substrate.

11. A lighting system comprising:
    a functional substrate;
    at least one light emitting element bonded onto the functional substrate; and
    at least one design-in thermal detection unit built onto the functional substrate, wherein the design-in thermal detection unit is proximate to a side of the light emitting element, and wherein the design-in thermal detection unit is configured to detect the temperature of the light emitting element and transmit a temperature signal;
    a power source operably coupled to the at least one light emitting element, the power source configured to provide a current to the at least one light emitting element;
    a microcontroller unit operably coupled to the power source and the design-in thermal detection unit, the microcontroller unit configured to control the current provided from the power source to the at least one light emitting element, the microcontroller unit further configured to receive the temperature signal from the design-in thermal detection unit; and
    at least one pair of pads bonded to the functional substrate, the at least one pair of pads configured for electrical connection, and wherein resistance of the functional substrate is indicative of the temperature of the light emitting element and is measurable via an electrical connection with the pads whereby the functional substrate performs as the at least one design-in thermal detection unit when the resistance of the functional substrate is measured to detect the temperature of the light emitting element.

12. The lighting system of claim 11, wherein the microcontroller unit is further configured to selectively adjust the current in response to the temperature signal.

13. The lighting system of claim 11, further comprising a look-up table operably coupled to the microcontroller unit, the look-up table including data that correlates the temperature signal to current.

14. The lighting system of claim 11, wherein a single fabrication process is used to fabricate both the design-in thermal detection unit and the functional substrate.

* * * * *